United States Patent [19]

Hamada et al.

[11] Patent Number: 5,693,382

[45] Date of Patent: Dec. 2, 1997

[54] FRAME-SUPPORTED PELLICLE FOR DUSTPROOF PROTECTION OF PHOTOMASK IN PHOTOLITHOGRAPHY

[75] Inventors: Yuichi Hamada; Satoshi Kawakami; Toru Shirasaki; Yoshihiko Nagata; Meguru Kashida; Yoshihiro Kubota, all of Gunma-ken, Japan

[73] Assignee: Shin-Etsu Chemical Co., Ltd., Tokyo, Japan

[21] Appl. No.: 647,140

[22] Filed: May 9, 1996

Related U.S. Application Data

[63] Continuation of Ser. No. 348,330, Dec. 2, 1994, abandoned.

[30] Foreign Application Priority Data

Dec. 13, 1993 [JP] Japan .................... 5-311913

[51] Int. Cl.⁶ .................................................. A47G 1/12
[52] U.S. Cl. .......................... 428/14; 428/421; 428/422; 359/350
[58] Field of Search ............................ 359/350; 428/14, 428/422, 421, 688, 210, 67

[56] References Cited

U.S. PATENT DOCUMENTS 5,344,677  9/1994  Hong .............................. 428/14
5,378,514  1/1995  Hamada .......................... 428/14

*Primary Examiner*—Elizabeth Evans
*Attorney, Agent, or Firm*—McAulay Fisher Nissen Goldberg & Kiel, LLP

[57] ABSTRACT

Disclosed is a frame-supported pellicle, which is an integral body consisting of a rigid frame and a transparent plastic film adhesively bonded to one end surface of the frame in a slack-free fashion, for dustproof protection of a photomask used in a photolithographic patterning work in the manufacture of fine electronic devices such as LSIs and liquid crystal display panels. The frame-supported pellicle is prepared by bonding the frame and plastic film with an adhesive having a glass transition temperature substantially lower than that of the polymeric resin forming the film and the adhesive bonding work is performed at a temperature higher than the glass transition temperature of the adhesive but lower than that of the polymeric resin of the film so that excellent adhesive bonding strength can be obtained between the frame and the resin film still without causing any adverse influences on the resin film such as distortion and crease formation.

4 Claims, No Drawings

FRAME-SUPPORTED PELLICLE FOR DUSTPROOF PROTECTION OF PHOTOMASK IN PHOTOLITHOGRAPHY

This is a continuation of application Ser. No. 08/348,330 filed Dec. 2, 1994 now abandoned.

BACKGROUND OF THE INVENTION

The present invention relates to a frame-supported pellicle for dustproof protection of a photomask used in photolithographic patterning works in the manufacture of fine electronic devices.

As is well known, the manufacturing process of various kinds of fine electronic devices including semiconductor-based devices such as LSIs, VLSIs and the like, liquid crystal display panels and so on involves a patterning work of, for example, a resist layer formed on the substrate plate such as a semiconductor silicon wafer. This patterning work is performed photolithographically by the pattern-wise exposure of the resist layer to ultraviolet light through a pattern-bearing transparency called a photomask followed by the development of the thus formed latent images in the resist layer. In view of the extremely high fineness of the pattern to be reproduced, it is essential that the photomask is absolutely free from any dust particles deposited thereon because scattering of the light beams is caused by the dust particles on the photomask resulting in a great decrease in the quality of the reproduced pattern.

In this regard, it is usual that the patterning work is conducted in a clean room in which the air is freed from dust particles floating therein as completely as possible. However, it is almost impossible to ensure perfect cleanness of the air even in a clean room of the highest class. Accordingly, it is also an established practice that the pattern-wise exposure with light is performed by mounting a frame-supported pellicle on the photomask. A frame-supported pellicle mentioned above is an integral device consisting of a frame made from a rigid material such as an aluminum alloy, stainless steel, polyethylene and the like and a highly transparent thin film of a plastic resin called a pellicle membrane spread over and adhesively bonded to one end surface of the pellicle frame in a drumhead-like slack-free fashion with an adhesive. When a frame-supported pellicle is mounted on the photomask, the dust particles floating in the air of the clean room are never deposited directly on the photomask but are deposited on the pellicle membrane so that the dust particles deposited on the pellicle membrane have little adverse influences on the quality of the reproduced pattern because the light beams for the pattern-wise exposure are focused to the pattern on the photomask and not to the pellicle membrane.

The synthetic plastic resin for the pellicle membrane is exemplified by nitrocellulose, cellulose acetate and the like and the pellicle membrane is bonded to the end surface of a pellicle frame by a method disclosed, for example, in Japanese Patent Kokai 58-219028 according to which the pellicle frame wet on one end surface with an organic solvent which can dissolve the plastic resin of the pellicle membrane is put on the plastic film followed by air-drying so that the plastic film is adhesively bonded to the pellicle frame to form the pellicle membrane. Alternatively, it is of course possible as is taught in U.S. Pat. No. 4,861,402 and Japanese Patent Publication 63-27707 to use an adhesive such as those based on an acrylic resin, epoxy resin and the like.

Since the adhesive used for bonding the pellicle membrane to the pellicle frame is under direct irradiation of the ultraviolet light for exposure in the photolithographic patterning work, the adhesive is required to be highly resistant against ultraviolet-induced degradation in order to ensure good durability of the frame-supported pellicle since otherwise the slack-free condition of the extremely thin pellicle membrane cannot be maintained for a long time to affect the quality of the reproduced pattern.

The adhesives conventionally based on an acrylic resin or epoxy resin and used for the bonding work of the pellicle membrane to the pellicle frame, however, are not quite satisfactory and not reliable because of the insufficient adhesive bonding strength not to ensure the slack-free condition of the membrane. In addition, these conventional adhesives are not highly resistant against ultraviolet irradiation to cause heavy photodegradation so that dust particles are sometimes formed from the thus photodegraded adhesives and the pellicle membrane is lifted from the pellicle frame or becomes ruptured. When the pellicle membrane is prepared from a fluorocarbon group-containing polymer, furthermore, no sufficient adhesive bonding strength can be obtained with these conventional adhesives due to the surface-releasing property of the membrane made from a fluorocarbon group-containing polymeric resin.

In view of the above described situations, the inventors have previously proposed a frame-supported pellicle prepared by adhesively bonding a pellicle membrane made from a fluorocarbon group-containing polymeric resin to a pellicle frame with an adhesive based on a fluorocarbon group-containing compound having a chemical structure resembling that of the polymeric resin forming the pellicle membrane at a temperature which is the same as or around the glass transition temperature of the adhesive or higher so that good adhesive bonding strength can be obtained between the pellicle membrane and the adhesive layer. This method, however, has a problem that, when the temperature, at which the pellicle frame coated with the adhesive is brought into contact with the pellicle membrane, is excessively increased to exceed the glass transition temperature of the polymeric resin forming the pellicle membrane in order to obtain a sufficiently high adhesive bonding strength, deformation and creases are frequently formed in the membrane per se.

SUMMARY OF THE INVENTION

The present invention accordingly has an object to provide a novel and improved frame-supported pellicle for dustproof protection of a photomask in the photolithographic patterning works, by which the above described problems and disadvantages in the conventional frame-supported pellicles can be solved. The present invention also has an object to provide a method for the preparation of such a frame-supported pellicle.

Thus, the frame-supported pellicle of the present invention is an integral body which comprises:

(a) a pellicle frame made from a rigid material and having substantially parallel end surfaces;

(b) a pellicle membrane which is a transparent film of a thermoplastic resin spread over and adhesively bonded to one of the end surfaces of the pellicle frame in a slack-free fashion; and (c) a layer of an adhesive intervening between the pellicle membrane and the end surface of the pellicle frame to adhesively bond the membrane and frame, the adhesive having a glass transition temperature substantially lower than the glass transition temperature of the thermoplastic resin forming the pellicle membrane.

In particular, it is desirable that the glass transition temperature of the adhesive is by at least 5° C. or, preferably, by at least 20° C. lower than the glass transition temperature of the thermoplastic resin of the pellicle membrane.

Further, the method of the present invention for the preparation of a frame-supported pellicle defined above comprises the steps of:

(1) coating one end surface of a pellicle frame made from a rigid material and having substantially parallel end surfaces with an adhesive having a glass transition temperature substantially lower than the glass transition temperature of the thermoplastic resin to form an adhesive layer;

(2) heating the film and the adhesive layer at a bonding temperature which is higher than the glass transition temperature of the adhesive but lower than the glass transition temperature of the thermoplastic resin;

(3) bringing into contact the film and the end surface of the pellicle frame coated with the adhesive layer; and (4) cooling the adhesive layer so as to adhesively bond the pellicle frame and the transparent film.

DETAILED DESCRIPTION OF THE PREFERRED EMBODIMENTS

The above described present invention has been established as a result of the extensive investigations undertaken by the inventors with an object to develop a frame-supported pellicle free from the above described disadvantages in the conventional frame-supported pellicles to arrive at a discovery that, when the adhesive for adhesively bonding the pellicle membrane to the pellicle frame is made from a polymer of the same type as or of a similar type to the polymer forming the pellicle membrane and has a glass transition temperature substantially lower than the glass transition temperature of the polymer forming the pellicle membrane, the adhesive can be heated at a temperature higher than the glass transition temperature thereof without exceeding the glass transition temperature of the pellicle membrane so that the pellicle membrane can be firmly bonded to the pellicle frame by adhesion without occurrence of distortion or creases leading to completion of the present invention after detailed studies on the relationship of the glass transition temperature between the adhesive and the thermoplastic resin forming the pellicle membrane and types of the adhesive and the membrane-forming thermoplastic resin.

The polymeric material forming the pellicle membrane in the inventive frame-supported pellicle is not particularly limitative and examples of the polymeric materials include nitrocellulose, poly(trimethyl vinyl silane) disclosed in Japanese Patent Kokai 2-230245, pullulan compounds disclosed in Japanese Patent Kokai 3-210561, amorphous fluorocarbon group-containing polymers disclosed in Japanese Patent Kokai 4-104155 such as copolymers of tetrafluoroethylene and vinylidene fluoride, ternary copolymers of tetrafluoroethylene, hexafluoropropylene and vinylidene fluoride, copolymers of tetrafluoroethylene and a fluorine-containing monomer having a cyclic perfluoroether group and the like, silicone modified polyvinyl alcohols disclosed in Japanese Patent Kokai 4-241351 and so on, of which the amorphous fluorocarbon group-containing polymers are preferred because they can be used for light in a wide range of wavelength and have excellent light-fastness.

Films of these polymeric materials suitable for use as a pellicle membrane can be prepared by a known solution casting method in which a solution prepared by dissolving the polymeric resin in a suitable organic solvent in a concentration of 3 to 10% by weight is spread by using a spin coater or knife coater on the mirror-polished surface of a silicon wafer or glass plate followed by drying into a film. The thus prepared resin film should have a thickness in the range from 0.1 to 10 μm or, preferably, from 0.5 to 5 μm in consideration of the balance between the mechanical strength and the transmissivity to light.

As to the transmissivity of light through the pellicle membrane, it is desirable from the practical standpoint that transmission of light is at least 95% or, preferably, at least 98% while even a pellicle membrane having a light transmission of 90% or larger can be used when the thickness thereof exceeds 5 μm in view of the fact that the light transmission of a pellicle membrane is a function of the film thickness and the wavelength of light. It is an advisable way to provide the pellicle membrane with a reflection-preventing coating film of magnesium fluoride, calcium fluoride and the like in order to improve transmission of light.

The type of the adhesive for adhesively bonding the pellicle membrane to the pellicle frame is not particularly limitative including those based on an acrylic resin, polybutene, polyurethane resin, cellulosic polymers, silicone resins, fluorocarbon resins, rubbery polymers and the like. When the pellicle membrane is made from an amorphous fluorocarbon group-containing polymer, however, it is preferable to use an adhesive based on a fluorocarbon group-containing polymeric resin of which the chemical structure is amorphous and of the same type as or similar type to the forming the pellicle membrane in view of the excellent compatibility therebetween. Such a fluorocarbon-based amorphous polymer can be used as an adhesive in the form of a solution prepared by dissolving in a fluorocarbon-based solvent.

The frame-supported pellicle of the present invention is prepared by adhesively bonding the above described pellicle membrane to one end surface of the rigid pellicle frame by use of the above described adhesive. It is essential that this bonding work is conducted at a temperature higher than the glass transition temperature of the adhesive but lower than the glass transition temperature of the polymer forming the pellicle membrane. This requirement necessarily precludes the use of an adhesive having a glass transition temperature higher than that of the membrane polymer because, when the glass transition temperature of the adhesive is higher than that of the membrane polymer, distortion and creases are formed in the pellicle membrane by the bonding work which is carried out at a temperature higher than the glass transition temperature of the adhesive to cause troubles in the use of the pellicle in the photolithographic patterning work.

In order that the adhesive bonding work of the pellicle membrane and the pellicle frame can be performed within such a limited temperature range, it is desirable that the glass transition temperature of the adhesive is lower by at least 5° C. or, preferably, by at least 20° C. than the glass transition temperature of the membrane polymer. When such a relationship in the glass transition temperatures is satisfied between the adhesive and the membrane polymer, the adhesive bonding work can be performed at a temperature substantially higher than the glass transition temperature of the adhesive in order to obtain a full adhesive bonding strength without causing distortion or crease formation in the pellicle membrane.

In the following, examples are given to illustrate the present invention in more detail.

EXAMPLE 1

A solution for the preparation of a resin film by the solution casting method was prepared by dissolving a copolymeric resin of tetrafluoroethylene and a fluorocarbon monomer having a cyclic perfluoroether group, of which the glass transition temperature was 108° C., (Cytop CTXS, a product by Asahi Glass Co.) in a solvent therefor recommended by the manufacturer (CTsolve 180, a product by the same company as above) in a concentration of 5% by weight. This resin solution was spread over the mirror-polished surface of a fused silica glass plate having a diameter of 200 mm and a thickness of 3 mm as a substrate by using a spin coater followed by drying at 180° C. for 15 minutes to give a transparent film of the resin having a thickness of 0.84 µm.

Separately, a surface-anodized square aluminum frame having an outer side length of 120 mm was coated on one end surface with a solution of an adhesive prepared by dissolving a copolymeric resin of tetrafluoroethylene and a fluorocarbon monomer having a cyclic perfluoroether group, of which the glass transition temperature was 69° C., (a product by Asahi Glass Co.) in the same solvent in a concentration of 10% by weight followed by drying at 50° C. for 1 hour to form an adhesive layer having a thickness of 0.2 mm. The pellicle frame provided with the adhesive layer was attached at the adhesive surface to the resin film and the assembly was heated at a temperature of 95° C. on a hot plate to effect adhesive bonding of the pellicle frame and the resin film followed by trimming of the resin film to complete a frame-supported pellicle.

With an object to test the adhesive bonding strength between the frame and the membrane, the pellicle membrane was gently pushed at the center portion with a plastic rod having a 10 mm by 10 mm square cross section with chamfered edges to find that separation of the membrane from the frame did not occur until the membrane was ruptured by increasing the pushing force indicating very firm adhesive bonding. The adhesive bonding between the frame and membrane was stable in the lapse of time without causing failure of the adhesive bonding or occurrence of creases.

EXAMPLE 2

A solution for the preparation of a resin film by the solution casting method was prepared by dissolving a copolymeric resin of tetrafluoroethylene and perfluoro(2,2-dimethyl-1,3-dioxole) having a glass transition temperature of 160° C. (Teflon AF1600, a product by Du Pont Co.) in a solvent therefor (Florinert FC-75, a product by Sumitomo 3M Co.) in a concentration of 3% by weight. This resin solution was spread over the mirror-polished surface of a fused silica glass plate having a diameter of 200 mm and a thickness of 3 mm as a substrate by using a spin coater followed by drying at 180° C. for 15 minutes to give a transparent film of the resin having a thickness of 0.84 µm.

Separately, a surface-anodized square aluminum frame having an outer side length of 120 mm was coated on one end surface with a solution of an adhesive prepared by dissolving a copolymeric resin of tetrafluoroethylene and a fluorocarbon monomer having a cyclic perfluoroether group, of which the glass transition temperature was 108° C., (Cytop CTXA, a product by Asahi Glass Co.) in the solvent therefor (CTsolv 180, supra) in a concentration of 10% by weight followed by drying at 150° C. for 3 hours to form an adhesive layer having a thickness of 0.2 min. The pellicle frame provided with the adhesive layer was attached at the adhesive surface to the resin film and the assembly was heated at a temperature of 120° C. on a hot plate to effect adhesive bonding of the pellicle frame and the resin film followed by trimming of the resin film to complete a frame-supported pellicle.

With an object to test the adhesive bonding strength between the frame and the membrane, the pellicle membrane was gently pushed at the center portion in the same manner as in Example 1 to find that separation of the membrane from the frame did not occur until the membrane was ruptured by increasing the pushing force indicating very firm adhesive bonding. The adhesive bonding between the frame and membrane was stable in the lapse of time without causing failure of the adhesive bonding or occurrence of creases.

EXAMPLE 3

A transparent resin film for pellicle membrane having a thickness of 1.4 µm was formed on the mirror-polished surface of a fused silica glass plate in the same manner as in the preceding examples from a 5% by weight solution of a cellulose propionate having a glass transition temperature of 100° C. in butanone-2 after drying at 150° C. for 20 minutes.

Separately, the same aluminum frame as in the preceding examples was coated on one end surface with a 20% by weight solution of a cellulose acetate having a glass transition temperature of 60° C. in butanone-2 followed by drying at 150° C. for 20 minutes to form an adhesive layer having a thickness of 0.2 min. The adhesive-coated pellicle frame and the resin film were bonded together in the same manner as in the preceding examples at a bonding temperature of 90° C. to complete a frame-supported pellicle.

With an object to test the adhesive bonding strength between the frame and the membrane, the pellicle membrane was gently pushed at the center portion in the same manner as in the preceding examples to find that separation of the membrane from the frame did not occur until the membrane was ruptured by increasing the pushing force indicating very firm adhesive bonding. The adhesive bonding between the frame and membrane was stable in the lapse of time without causing failure of the adhesive bonding or occurrence of creases.

Comparative Example 1

A resin film of the fluorocarbon polymer (Cytop CTXS, supra) was formed on a fused silica glass plate in just the same manner as in Example 1.

Separately, the same aluminum frame as in the preceding examples was coated on one end surface with a 10% by weight solution of another fluorocarbon copolymeric resin having a glass transition temperature of 108° C. (Cytop CTXA, supra) in the same solvent as used in Example 1 (CTsolv 180) followed by drying at 150° C. for 1 hour to form an adhesive layer having a thickness of 0.2 mm. The adhesive-coated pellicle frame and the resin film were bonded together in the same manner as in the preceding examples at a bonding temperature of 95° C. to complete a frame-supported pellicle.

With an object to test the adhesive bonding strength between the frame and the membrane, the pellicle membrane was gently pushed at the center portion in the same manner as in the preceding examples to find that separation of the membrane from the frame took place before the pellicle membrane was ruptured indicating insufficient adhesive bonding strength therebetween.

Comparative Example 2

The materials and procedure for the preparation of a frame-supported pellicle were just the same as in Comparative Example 1 except that the temperature for bonding the adhesive-coated pellicle frame and the resin film was 110° C. instead of 95° C.

With an object to test the adhesive bonding strength between the frame and the membrane, the pellicle membrane was gently pushed at the center portion in the same manner as in the preceding examples to find that separation of the membrane from the frame did not occur until the membrane was ruptured by increasing the pushing force indicating very firm adhesive bonding. The pellicle membrane, however, was distorted and had a large number of creases along the pellicle frame.

What is claimed is:

1. A frame-supported pellicle for dustproof protection of a photomask in a photolithographic patterning work which is an integral body comprising:

(a) a pellicle frame made from a rigid material and having substantially parallel end surfaces;

(b) a pellicle membrane which is a transparent film of a fluorocarbon group-containing polymeric resin spread over and adhesively bonded to one of the end surfaces of the pellicle frame in a slack-free fashion; and (c) a layer of an adhesive intervening between the pellicle membrane and the end surface of the pellicle frame to adhesively bond the membrane and frame, the adhesive having a glass transition temperature lower by at least 5° C. than the glass transition temperature of the polymeric resin forming the pellicle membrane.

2. The frame-supported pellicle as claimed in claim 1 in which the glass transition temperature of the adhesive is lower by at least 20° C. than the glass transition temperature of the plastic resin forming the pellicle membrane.

3. The frame-supported pellicle as claimed in claim 2 wherein the bonding of the adhesive and membrane is carried out at a temperature above the glass transition temperature of the adhesive and below the glass transition temperature of the membrane, such that a full adhesive bond is obtained and the membrane has no distortion or crease formation.

4. The frame-supported pellicle as claimed in claim 1 wherein the bonding of the adhesive and membrane is carried out at a temperature above the glass transition temperature of the adhesive and below the glass transition temperature of the membrane, such that a full adhesive bond is obtained and the membrane has no distortion or crease formation.

* * * * *